US011499392B2

(12) United States Patent
Jandhyala

(10) Patent No.: US 11,499,392 B2
(45) Date of Patent: Nov. 15, 2022

(54) DESIGNING A WELLBORE CEMENT SHEATH IN COMPACTING OR SUBSIDING FORMATIONS

(71) Applicant: Halliburton Energy Services, Inc., Houston, TX (US)

(72) Inventor: Siva Rama Krishna Jandhyala, Pune (IN)

(73) Assignee: Halliburton Energy Services, Inc., Houston, TX (US)

(*) Notice: Subject to any disclaimer, the term of this patent is extended or adjusted under 35 U.S.C. 154(b) by 790 days.

(21) Appl. No.: 16/470,465

(22) PCT Filed: Aug. 1, 2018

(86) PCT No.: PCT/US2018/044864
§ 371 (c)(1),
(2) Date: Jun. 17, 2019

(87) PCT Pub. No.: WO2020/027834
PCT Pub. Date: Feb. 6, 2020

(65) Prior Publication Data
US 2021/0324704 A1    Oct. 21, 2021

(51) Int. Cl.
*E21B 33/14* (2006.01)
*G06F 30/23* (2020.01)
(Continued)

(52) U.S. Cl.
CPC .............. *E21B 33/14* (2013.01); *E21B 47/06* (2013.01); *E21B 49/006* (2013.01); *G06F 30/23* (2020.01)

(58) Field of Classification Search
CPC ........ E21B 33/14; E21B 47/06; E21B 49/006; E21B 43/11; E21B 49/00; E21B 47/005;
(Continued)

(56) References Cited

U.S. PATENT DOCUMENTS 6,793,730 B2    9/2004 Reddy et al.
7,133,778 B2   11/2006 Ravi et al.
(Continued)

FOREIGN PATENT DOCUMENTS

WO       2016032677 A1    3/2016
WO    WO-2016032677 A1 *  3/2016    ............. E21B 33/13

OTHER PUBLICATIONS

Diana, "Finite Element Analysis User's Manual", Material Library, TNO Diana BV, Release 9.4.4, Dec. 5, 2011, 555 pages.
(Continued)

*Primary Examiner* — Catherine T. Rastovski
*Assistant Examiner* — Kaleria Knox
(74) *Attorney, Agent, or Firm* — Kilpatrick Townsend & Stockton LLP

(57) ABSTRACT

A method to design a wellbore cement sheath in compacting or subsiding formations is provided. The method may include performing a field scale analysis on a formation surrounding a wellbore. The field scale analysis may output boundary conditions including a pore pressure of the formation and a three-dimensional movement of the formation. The method may also include performing a wellbore scale analysis based on the boundary conditions, a wellbore scale model, wellbore conditions, and cement material properties. The wellbore scale analysis may output an indication of stress applied over time to a cement sheath within the wellbore. Further, the method may include determining cement material properties of the cement sheath to withstand the stress applied over time output by the wellbore scale analysis, and the method may include installing the cement sheath within the wellbore. The cement sheath may include the cement material properties.

19 Claims, 7 Drawing Sheets

(51) Int. Cl.
*E21B 47/06* (2012.01)
*E21B 49/00* (2006.01)

(58) Field of Classification Search
CPC ........... E21B 7/04; G06G 30/23; G06F 30/20; G01V 99/005
See application file for complete search history.

(56) References Cited

U.S. PATENT DOCUMENTS

| | | | |
|---|---|---|---|
| 8,322,198 B2 | 12/2012 | Iverson et al. | |
| 2007/0062691 A1 | 3/2007 | Reddy et al. | |
| 2009/0250209 A1* | 10/2009 | Ramakrishnan | E21B 47/005 166/250.14 |
| 2010/0212892 A1* | 8/2010 | Santra | C09K 8/467 166/250.14 |
| 2011/0040536 A1* | 2/2011 | Levitan | E21B 49/00 703/2 |
| 2011/0166843 A1* | 7/2011 | Hsu | G01V 99/005 702/11 |
| 2013/0118808 A1* | 5/2013 | Yang | E21B 7/04 175/24 |
| 2014/0174732 A1* | 6/2014 | Goodwin | E21B 33/13 166/255.1 |
| 2015/0218925 A1* | 8/2015 | Lecampion | E21B 43/11 166/297 |
| 2017/0096874 A1* | 4/2017 | Parsons | G06F 30/20 |
| 2017/0183964 A1* | 6/2017 | Jandhyala | E21B 33/14 |

OTHER PUBLICATIONS

Xinpu Shen, Halliburton, "Subsidence Prediction and Casing Integrity With Respect to Pore-Pressure Depletion With 3D Finite-Element Method", SPE 138338, Dec. 1-3, 2010, pp. 1-11.
Kenter et al., "Compaction Study for Shearwater Field", SPE/ISRM 47280, Jul. 8-10, 1998, pp. 1-6.
Kristiansen, "Drilling Wellbore Stability in the Compacting and Subsiding Valhall Field", IADC/SPE 87221, Mar. 2-4, 2004, pp. 1-15.
Pattillo et al., "Reservoir Compaction and Seafloor Subsidence at Valhall", SPE/ISRM 47274, Jul. 8-10, 1998, pp. 1-10.
International Patent Application No. PCT/US2018/044864, "International Search Report and Written Opinion", dated Apr. 26, 2019, 14 pages.
GB Application No. GB2016218.6, "First Examination Report", dated Mar. 8, 2022, 4 pages.

* cited by examiner

DESIGNING A WELLBORE CEMENT SHEATH IN COMPACTING OR SUBSIDING FORMATIONS

TECHNICAL FIELD

The present disclosure relates to designing cement sheaths used in a wellbore. More specifically, this disclosure relates to designing the cement sheaths to withstand stresses applied to the cement sheath in compacting or subsiding formations.

BACKGROUND

In producing oilfield wells, a loss of long-term zonal isolation of the well may occur due to cement sheath failure resulting from compacting or subsiding formations. In the compacting or subsiding formations, production of hydrocarbons surrounding the well may result in pore collapse within the formations. The pore collapse within the formation may be a result of fluid pressure loss within the pores of the formations as hydrocarbon production increases.

Because a cement sheath may be located at a boundary between a wellbore and the subsiding formation, the cement sheath may lose structural support from the formation as pores collapse in the formation or as a result of other formation shifts. Therefore, improved methods are provided for designing a wellbore cement sheath in a compacting or subsiding formation.

DETAILED DESCRIPTION

Figure 1:
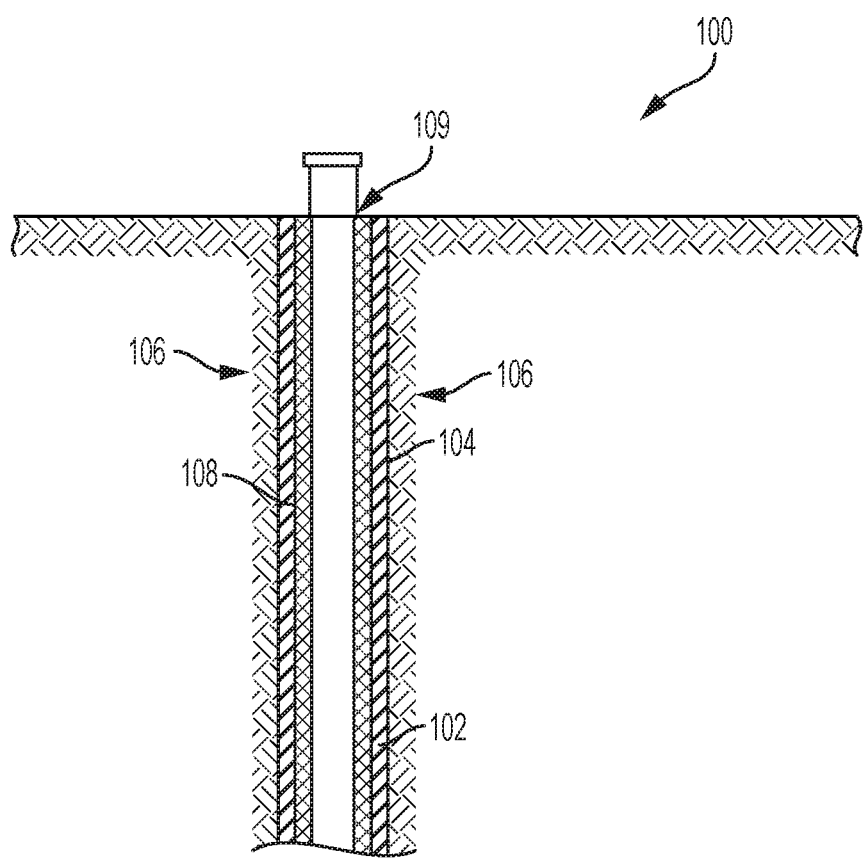
FIG. 1 is a cross-sectional view of an example of a well system that includes a cement sheath according to some aspects of the present disclosure.

Certain aspects and examples of the disclosure relate to methods to design and install a wellbore cement sheath for use in compacting or subsiding formations. The wellbore cement sheath may be installed along a wall of a wellbore of a hydrocarbon production well between a casing and the wall of the wellbore. A combination of the casing and the cement sheath may stabilize the wellbore and provide a smooth internal surface along a length of the wellbore for installing and removing hydrocarbon production equipment. Further, the casing and cement sheath may enable zonal isolation within the wellbore to isolate formations with different pressure gradients. By isolating formation zones within the wellbore, production or stimulation of the different isolated formation zones may be accomplished.

Benefits of the casing and cement sheath installed within the wellbore may be compromised when a formation surrounding the wellbore experiences subsidence or compaction. For example, the cement sheath may fail when the wellbore loses support from the formation due to the subsidence or compaction of the formation at or near the wellbore. Upon failure of the cement sheath, zonal isolation may be lost within the wellbore due to cracks, fissures, or breakages in the cement sheath. Losing zonal isolation may result in an introduction of formation fluids into the wellbore from unintended or undesirable locations and a decrease in production or stimulation efficiency.

To avoid such failures, the cement sheath may be designed to withstand forces associated with compaction and subsidence of a formation surrounding a wellbore. Designing the cement sheath may be based on modeling a formation, the cement sheath, and a casing together. Due to differences in scaling of the different components in a radial direction, a straight forward modeling approach may be computationally prohibitive or impractical. To avoid the computationally prohibitive techniques, a multi-scaling approach of modeling a formation may be used to design such a cement sheath. The multi-scaling model may include a field analysis and a wellbore scale analysis. The field scale analysis may include a model of a response of a large portion of a formation to an expected production load in the modeled portion of the formation. The wellbore scale analysis may include a model of an area immediately surrounding a wellbore that takes into account well construction and completion loads, material properties of casing, cement and formation properties, and the boundary conditions of the wellbore provided by the field scale analysis. Such a multi-scaling approach makes the combined modelling of the wellbore components much more computationally efficient than the straight forward modeling approach when designing the cement sheaths.

Using the field scale model and the wellbore scale model, forces experienced by the cement sheath may be modeled over a period of time, such as a production lifespan of the well associated with the wellbore. The cement sheath may be designed and installed with properties capable of withstanding the modeled forces over the production lifespan of the well. Accordingly, production of the well may continue for the production lifespan of the well with limited risk of cement sheath failure by subsidence and compaction of the formation surrounding the well.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 is a cross-sectional view of an example of a well system 100 that includes a cement sheath 102 positioned within a wellbore 104 according to some aspects. The wellbore 104 may extend through various earth strata such as a hydrocarbon bearing subterranean formation 106. A casing string 108 extends from the surface 109 to the subterranean formation 106 at a downhole end of the wellbore 104. The casing string 108 can provide a conduit through which formation fluids, such as production fluids produced from the subterranean formation 106, can travel from the wellbore 104 to the surface 109. The casing string 108 can be coupled to the walls of the wellbore 104 via the cement sheath 102. For example, the cement sheath 102 can be positioned or formed between the casing string 108 and the walls of the wellbore 104 to couple the casing string 108 to the wellbore 104.

The well system 100 is depicted with a vertical wellbore 104, however, the well system 100 may include horizontal wellbores or directionally drilled wellbores. Horizontal drilling and directional drilling may allow the wellbore to stay within a payload of the subterranean formation 106 for an extended distance. The casing string 108 and the cement sheath 102 may also extend a length of the wellbore 104 in both the horizontal wells and the directionally drilled wells.

In some examples, the subterranean formation 106 may experience compaction or subsidence as the hydrocarbons are produced by the well system 100. For example, production induced depletion may result in the collapse of pores within the subterranean formation 106. Such a collapse may result in compaction of the reservoir surrounding the subterranean formation 106. As used herein, the term reservoir may be defined as a portion of the subterranean formation 106 that includes a rock structure with sufficient porosity and permeability to store hydrocarbons until production of the hydrocarbons.

The compaction of the reservoir may result in formation layers located above the compacted reservoir shifting axially. The axial shift of the formation layers located above the compacted reservoir may also be referred to as subsidence. The subsidence of the formation layers may include axial movement of portions of the wellbore 104, which may result in damage to the cement sheath 102 or the casing string 108 if the cement sheath 102 is not designed to adequately withstand and redistribute loads due to a subsidence event. Damage to the cement sheath 102 may induce a zonal isolation failure, which may interfere with further production by the well system 100.

Figure 2:
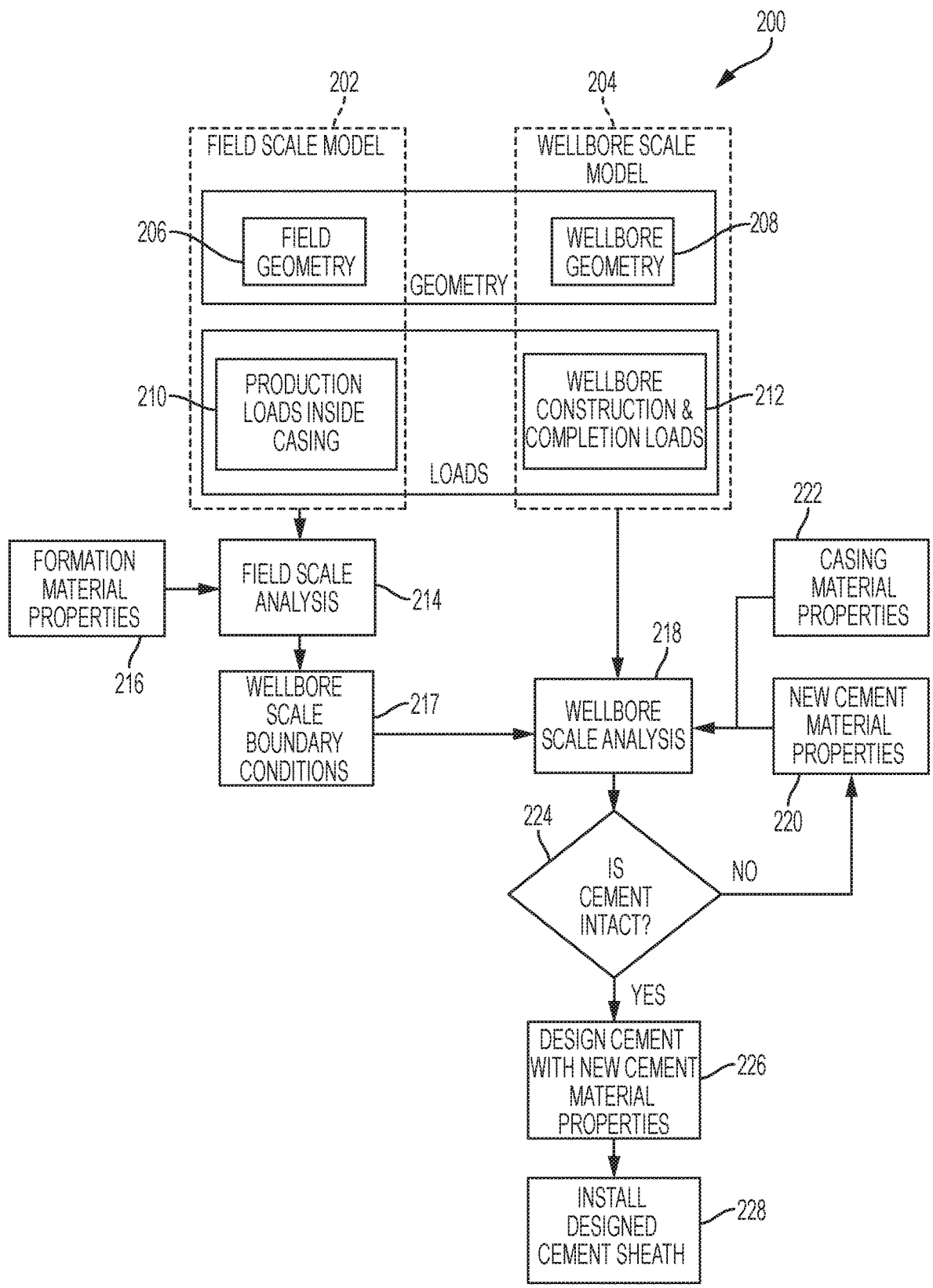
FIG. 2 is a flow chart of a process for designing and installing a cement sheath within a wellbore.

FIG. 2 is a flow chart of a process 200 for designing and installing the cement sheath 102 within the wellbore 104 according to some aspects. The cement sheath 102 may be designed to withstand formation subsidence or compaction events over a production lifespan of the well system 100. To design the cement sheath 102 in such a manner, a field scale model 202 and a wellbore scale model 204 may be employed to predict forces likely to act on the cement sheath 102 based on field geometry 206, wellbore geometry 208, production loads 210, and wellbore construction and completion loads 212. The field geometry 206 may generally include a large physical domain of the formation 106 surrounding the wellbore 104. For example, the field geometry 206 may include formation properties extending in a 5 km radius from the location of the wellbore 104. Other radii are also contemplated. Further, the field geometry 206 may not include geometry of the cement sheath 102 and the casing string 108. Variations in the large physical domain of the field geometry are typically a function of only a pore pressure versus time behavior of the field due to production loads, fracturing loads, injection loads, or any other operations that may change the pore pressure within the formation 106 surrounding the wellbore 104. The variations to the large physical domain of the field geometry are generally insensitive to finer variations associated with the cement sheath 102 and the casing string 108.

The wellbore geometry 208 may include the small physical domain of the wellbore 104 and the formation 106 immediately surrounding the wellbore 104. For example, the wellbore geometry 208 may include the geometry of the formation 106 within a 500 inch radius of the wellbore 104. Other radii are also contemplated. Further, the wellbore geometry 208 may include geometry of the cement sheath 102 and the casing string 108.

The production loads 210 of the field scale model 202 may include a hydrocarbon production pressure at the wellbore 104. That is, the production loads 210 may be the pressure exerted on the formation 106 due to production of hydrocarbons located within the formation 106. The wellbore construction and completion loads 212 of the wellbore scale model 204 may include the loads provided at the wellbore 104 by the cement sheath 102 and the casing string 108 that are employed during construction and completion of the wellbore 104. The field scale model 202 may focus on general compaction and subsidence activities in the formation, and the wellbore scale model 204 may focus on the effects of the compaction and subsidence activities in the formation immediately surrounding the wellbore 104 including details more closely related to the actual characteristics of the wellbore 104.

At block 214, the process 200 involves performing a field scale analysis using the field scale model 202 and formation material properties 216. Analysis in this context may include the process of finding the mechanical response to thermo-structural loads. The formation material properties 216 may include tensile strength, compressive strength, Young's modulus, Poisson's ratio, or any combination thereof of each formation layer of the subterranean formation 106. The field scale model 202 may be performed for each of the formation layers at time intervals over the desired production lifespan of the well system 100. That is, the field scale model 202 may analyze a field scale response of the formation 106 based on an estimated production load 210, the field geometry 206, and the formation material properties 216.

To generate the formation material properties 216, the tensile strength and compressive strength of the layers of the formation 106 may be measured. In an example, these properties may be measured at different confining stresses in a drained state using a formation core sample of a layer of the formation 106. The drained state of the formation core sample may indicate that pore fluid is allowed to drain from the formation core sample prior to measurement of the formation core sample such that pore pressure is maintained at a constant level. Such a state may represent behavior of the formation 106 in a manner similar to downhole conditions.

Other material properties 216 along with the tensile and compressive strengths are a Young's modulus and Poisson's ratio of the formation 106. The combination of the tensile strength, the compressive strength, the Young's modulus, and the Poisson's ratio of the formation 106 may be sufficient to characterize the formation 106 that does not compact. Such formations demonstrating non-pore compaction behavior (e.g., nonporous formation layers) may be represented by failure models for porous brittle materials. In an example, the failure models may include the Mohr-Coulomb model or the Drucker-Prager model.

The non-pore compaction behavior failure models may apply to layers of the formation 106 that conserve a volume of the formation 106. In a layer of the formation 106 that includes pore compaction, such failure models may not be sufficient, as the pore compaction involves a net volume change in the formation 106. Accordingly, for the layers of the formation 106 exhibiting pore compaction, a Cam-Clay type model may be used in place of the non-pore compaction failure models.

In the Cam-Clay type model used when the layer of the formation 106 exhibits pore compaction (e.g., porous formation layers), a failure envelope may vary non-linearly with an increase in confining stress (i.e., stress imposed on a layer of the formation 106 by a weight of overlaying material and a decreasing pore pressure in the formation 106 due to production) in such a way that pore compaction may weaken the formation. Until an instance when a failure envelope begins to flatten due to pore compaction, formation strength may be controlled predominantly, but not completely, by a shear failure mechanism. Upon reaching the instance where the failure envelope begins to flatten, the formation failure may be dominated by pore compaction involving crushing of grains of the formation 106. Due to a pore compaction failure involving volumetric changes (e.g., occurring as the failure envelope begins to flatten), an axial deformation may occur in the formation 106 that overlies a compacting area and provides the confining stress to the compacting area. This axial deformation may manifest as a subsidence event on the surface 109 of the well system 100.

Results of the field scale analysis at block 214 may provide an output of a wellbore scale boundary condition 217. That is, the field scale analysis of block 214 may generate a model of formation characteristics in an area immediately surrounding the wellbore 104. Such boundary conditions 217 may include pore pressures over time of the layers of the formation 106 surrounding the wellbore 104, as well as an indication of three dimensional movements of the formation 106 over time due to subsidence and compaction events.

At block 218, the process 200 involves performing a wellbore scale analysis using the wellbore scale model 204, the wellbore scale boundary conditions 217, cement material properties 220 for the cement sheath 102, and casing material properties 222 for the casing string 108. Analysis in this context may refer to the process of finding a mechanical response of the formation 106, the cement sheath 102, and the casing string 108 to thermo-structural loads. The wellbore scale boundary conditions may include pore pressures of the layers of the formation 106 over the production lifespan of the well system 100 and three-dimensional formation movements of the formation 106 surrounding the wellbore 104 over the production lifespan of the well system 100. Further, the cement material properties 220 provided to block 218 may be a register of cement properties available for the cement sheath 102. The cement material properties 220 may include tensile strength, compressive strength, Young's modulus, Poisson's ratio, hydration volumetric change, creep, or any combination thereof. Additionally, the casing material properties 222 of the casing string 108 may include information provided by the manufacturer of the casing string 108 in a specification document. Other sources of information regarding the cement material properties 220 and the casing material properties 222 may also be provided to block 218.

At block 224, the process 200 involves determining whether the cement sheath 102, constructed using the cement material properties 220, will remain intact during the production lifespan of the well system 100. This determination may be made based on the results of the wellbore scale analysis at block 218, and the determination may be referred to as calibrating the cement material properties 220. For example, the wellbore scale analysis at block 218 may provide an indication of the minimum expected stress experienced by the cement sheath 102 during time intervals covering the production lifespan of the well system 100. In such an example, the minimum expected stress experienced by the cement sheath 102 may account for expected subsidence events of the formation. Prediction of the subsidence events may be based on properties of the formation layers and an expected production rate of the reservoir. The cement sheath 102 is then analyzed to determine if the cement sheath 102 remains intact over the lifespan of the well system 100 based on the predicted minimum expected stresses on the cement sheath 102.

If the cement sheath 102 is not expected to remain intact, new cement material properties 220 are provided to the wellbore scale analysis at block 218, and the wellbore scale analysis is conducted again using the new cement material properties 220. In an example, a register of the cement material properties 220 may include an ordered list of cement mixtures based on price. The cement material properties 220 provided to the wellbore scale analysis at block 218 may be incremented through a register of the cement material properties 220 until one or more of the cement material properties 220 are identified that generate the cement sheath 102 expected to remain intact over the production lifespan of the well system 100.

When the block 224 makes a determination that the cement sheath 102 with the cement material properties 220 is expected to remain intact during the production lifespan of the well system 100, at block 226, the process 200 involves designing and testing a cement mixture for the cement sheath 102 that includes the cement material properties 220. The designing and testing of the cement mixture may occur in a laboratory. Because a cement mixture may include many formulations resulting in similar cement material properties 220, the cement mixture used for the cement sheath 102 may be selected based on a mixture that satisfies any other design specifications of a particular cement sheath 102.

At block 228, the process 200 involves installing the cement sheath 102 using the cement mixture designed at block 226. The cement sheath 102 may be designed and installed to withstand the minimum expected stress on the cement sheath 102 over an expected lifetime of the well system 100. For example, the cement sheath 102 may be designed to withstand expected stress resulting from subsidence or compaction events within formation layers surrounding the wellbore 104 during a production lifespan of the wellbore 104.

A computing system may perform the process 200, and the computing system may include one or more memory devices and one or more processing devices. The memory devices may include a non-transitory computer-readable medium capable of storing instructions for performing the process 200. Additionally, the memory devices may store the data associated with the process 200. In one or more embodiments, the memory devices and the processing devices are located at the surface 109 of the well system 100. In other embodiments, the memory devices and the processing devices are located remotely from the well system 100.

Figure 3:
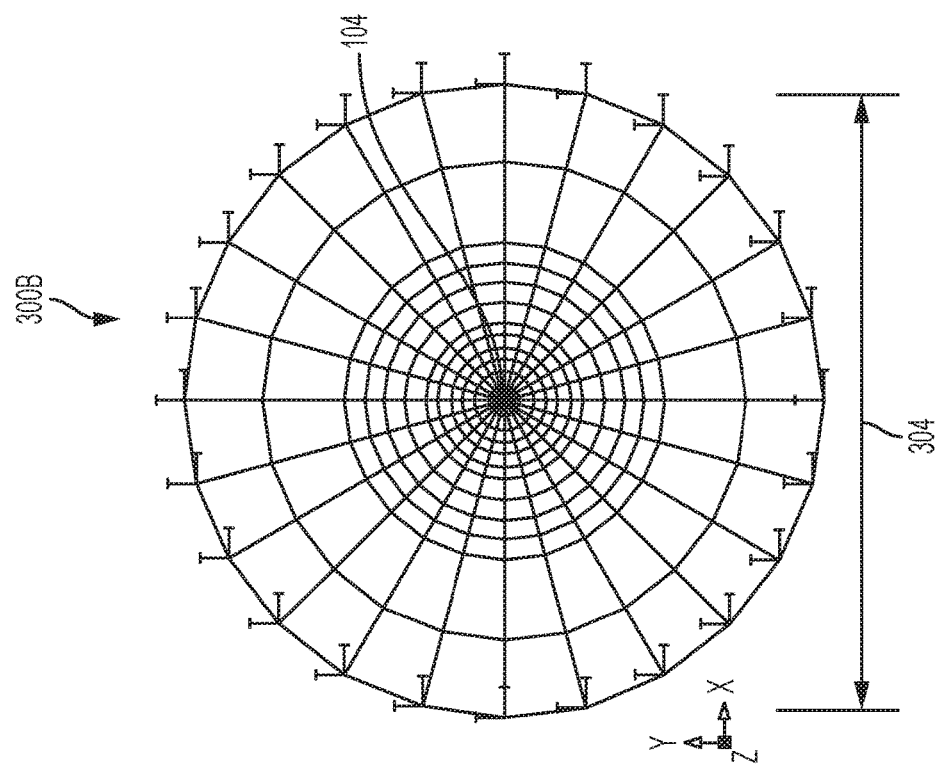
FIG. 3 is a side view and an overhead view of an example of a field scale model according to some aspects of the present disclosure.
Figure 3:
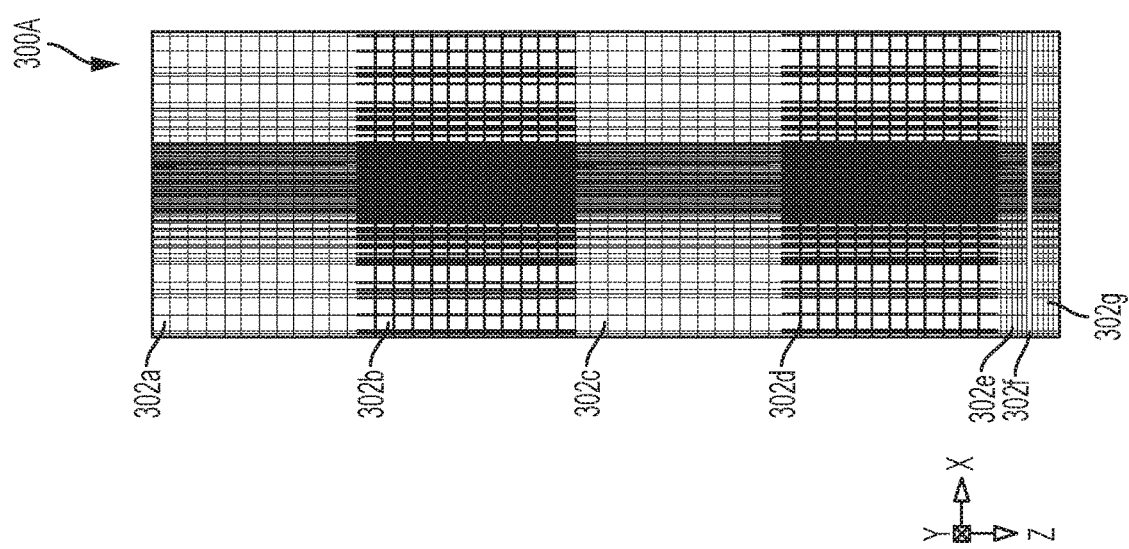

FIG. 3 is a side view 300a and an overhead view 300b of an example of a field scale model 202 according to some aspects. The side view 300a depicts seven different formation layers 302a-302g making up the formation 106 surrounding the wellbore 104. Each of these formation layers 302a-302g have varying material (e.g., mathematical) properties that are analyzed by the field scale model 202 to determine pore pressures and three-dimensional formation movements occurring within the formation 106. The formation layers 302a-302g, which may be representative of different types of the formation 106 located at different depths downhole from the surface 109, may be determined based on logging while drilling operations, measurement while drilling operations, drilling operations themselves (e.g., analysis of cuttings at varying depths of the wellbore 104, operator experience or knowledge of a particular location, or any combination thereof.

While the seven formation layers 302a-302g are illustrated, more or fewer formation layers 302 may be used when performing the field scale model 202. For example, some formations 106 may include substantially the same material until the payload of the reservoir is reached. Accordingly, fewer than sever formation layers 302 may be used in such an example.

The overhead view 300b of the field scale model 202 shows the scope of the field scale modelling. For example, a diameter 304 may represent how far from the wellbore 104 the field scale model 202 extends. The diameter 304 may be 10 km (i.e., 5 km in all directions from the wellbore 104) or more while maintaining sufficient computational efficiency and accuracy. Because of the relatively large scale when compared to the scale of the wellbore scale model 204 (e.g., approximately 50 times a radius of the wellbore 104), the field scale model only accounts for the pore pressures and three-dimensional formation movements of the formation layers 302a-302g. Further, in the overhead view 300b, the field scale model 202 may not be circular. For example, the field scale model 202 may take any shape as long as the field scale model 202 covers a lateral extent of the field of the wellbore 104 of interest.

The field scale model 202 may generally be insensitive to wellbore size, cement sheath and casing properties, and well construction loads. However, the field scale model 202 may be influenced by production loads on the formation layers 302a-302g due to an effect of the production loads on subsidence. In an example, as the production loads increase at a rate beyond replenishment speed of the reservoir, the formation layers 302a-302g with porous characteristics may lose pore pressure. Such a loss in pore pressure may result in subsidence and compaction of one or more of the formation layers 302a-302g when the one or more formation layers 302a-302g are unable to support the formation 106 after the change in pore pressure. Thus, the field scale model 202 may be performed using a source/sink load for pore pressure at a location of the wellbore 104. Further, if neighbor wellbores are located within the boundary of the field scale model 202, and the neighbor wellbores are being produced at the same time as the wellbore 104 of interest, the field scale model 202 may be performed using a source/sink load for pore pressure at a location of both the wellbore 104 of interest and the locations of the producing neighbor wellbores.

Figure 4:
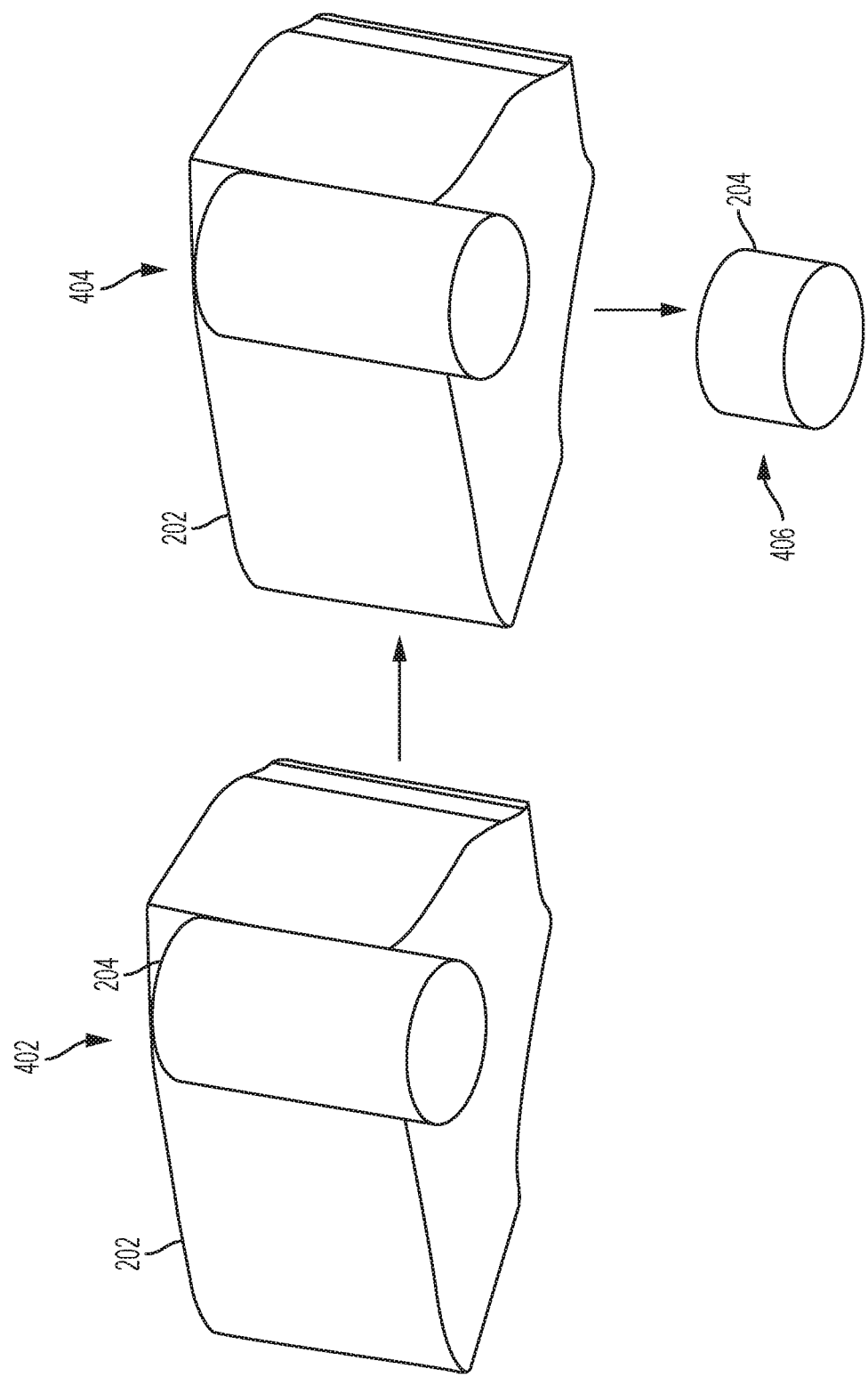
FIG. 4 is a visual representation of boundary conditions imported into a wellbore scale analysis from a field scale analysis according to some aspects of the present disclosure.

FIG. 4 is a visual representation of the boundary conditions 217 imported into the wellbore scale analysis from the field scale analysis according to some aspects. A combined scale model 402 depicts both the field scale model 202 and the wellbore scale model 204. Because the field scale model 202 has a much larger radial extent than the wellbore scale model 204 (e.g., 5 or more kilometers for the field scale model 202 versus tens of meters for the wellbore scale model 204), the entire radial extent of the field scale model 202 is not illustrated in FIG. 4. Due to computational efficiency and accuracy concerns, the combined scale model 402 is modelled in sections.

The field scale model 202 and accompanying field scale analysis is performed on the formation layers 302a-302g of the formation 106 independent from the wellbore scale model 204 to produce an independent model 404. The results of the independent model 404 may be based on the field geometry 206 of the formation layers 302a-302g and the production loads 210 acting on the formation layers 302a-302g. The field scale analysis of the independent model 404 with the formation material properties 216 may result in an indication of pore pressure of the formation layers 302a-302g over time and three-dimensional formation movements of the formation layers 302a-302g over time. The pore pressures and the three-dimensional formation movements of the formation layers 302a-302g may represent boundary conditions 217 of the formation 106 and the wellbore 104 that are used by the wellbore scale analysis.

When the wellbore scale model 204 is performed, the wellbore geometry 208 and the wellbore construction and completion loads 212 may be used to generate a dependent model 406. The dependent model 406 may be analyzed using the wellbore scale analysis which also relies on the boundary conditions 217, the casing material properties 222, and the cement material properties 220 to accurately predict stresses exerted on the cement sheath 102 over the lifespan of the well system 100. These predicted stresses are used to calibrate the cement material properties 220 of the cement sheath 102 in a manner that maintains the integrity of the cement sheath 102 throughout the lifespan of the well system 100.

Figure 5:
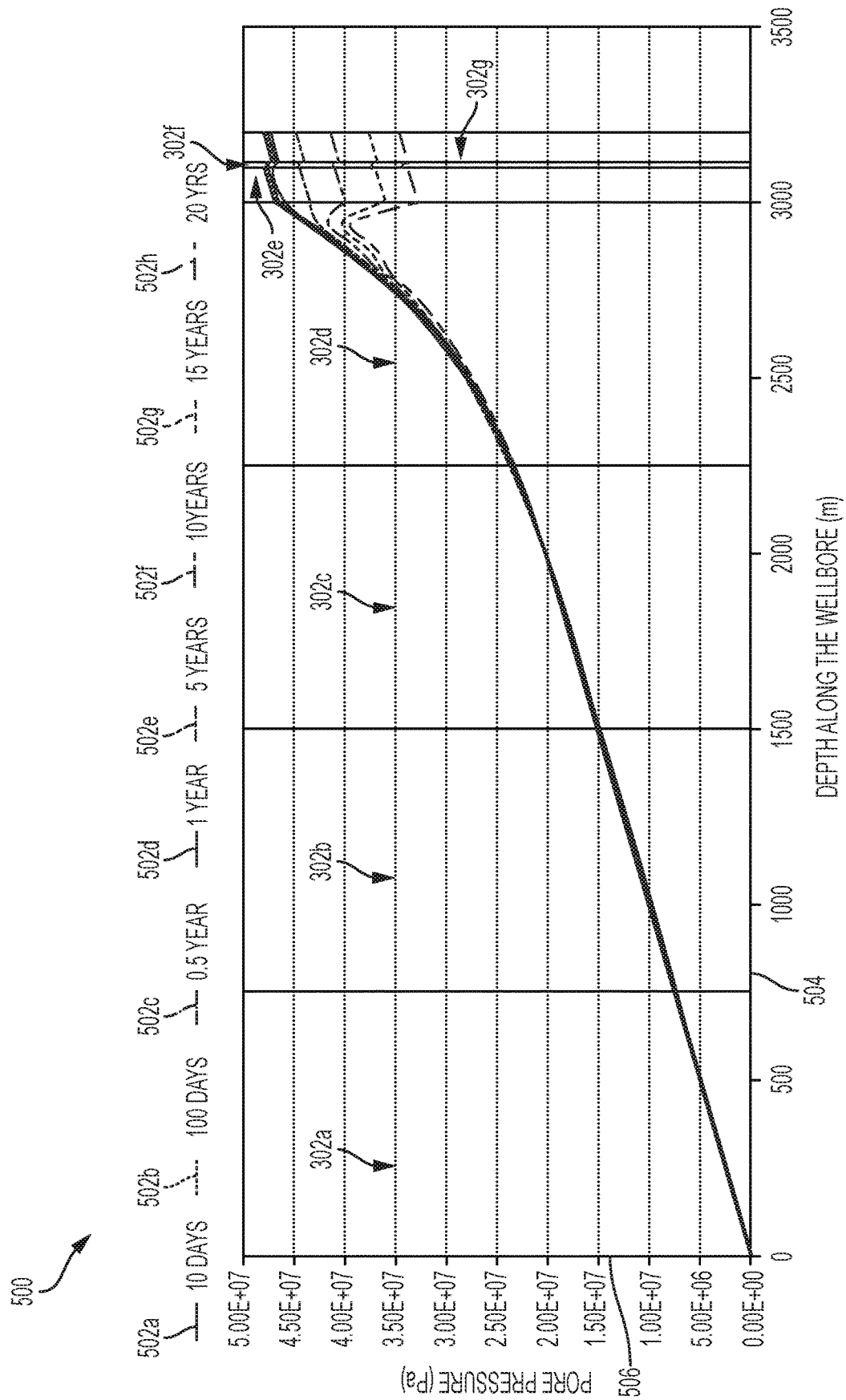
FIG. 5 is a chart depicting pore pressure of a formation as a function of depth along a wellbore at a particular radial distance for varying time intervals according to some aspects of the present disclosure.

FIG. 5 is a chart 500 depicting pore pressure of the formation 106 as a function of depth along the wellbore 104 at a particular radial extent from a mouth of the wellbore 104 for varying time intervals according to some aspects. As illustrated, the chart 500 includes an abscissa 504 representing a depth along the wellbore 104 in meters, and the chart 500 includes an ordinate 506 representing pore pressure along the wellbore 104 in pascals. The depth to pore pressure is charted at 10 days by line 502a, 100 days by line 502b, 0.5 years by line 502c, 1 year by line 502d, 5 years by line 502e, 10 years by line 502f, 15 years by line 502g, and 20 years by line 502h.

The chart 500 is divided into the formation layers 302a-302g described above with respect to FIG. 3. Each of the formation layers 302a-302g may represent layers of the formation 106 with different physical properties. Accordingly, the field scale analysis generating the depth to pore pressure of the chart 500 may react differently in each of the formation layers 302a-302g. The lines 502a-502h may begin to diverge at a depth of approximately 2250 meters, which may be at a start of the formation layer 302d. The decrease in pore pressure over time may be the result of production within one or more of the formation layers 302. For example, the pore pressure decrease toward the boundary of formation layers 302d and 302e may indicate hydrocarbon production at that depth. Further, the pore pressure decrease within the formation layer 302f may also be indicative of hydrocarbon production within the formation layer 302f. The decreases in pore pressure may result in subsidence and compaction of the formation 106, which may lead to three-dimensional movement of the formation 106.

Figure 6:
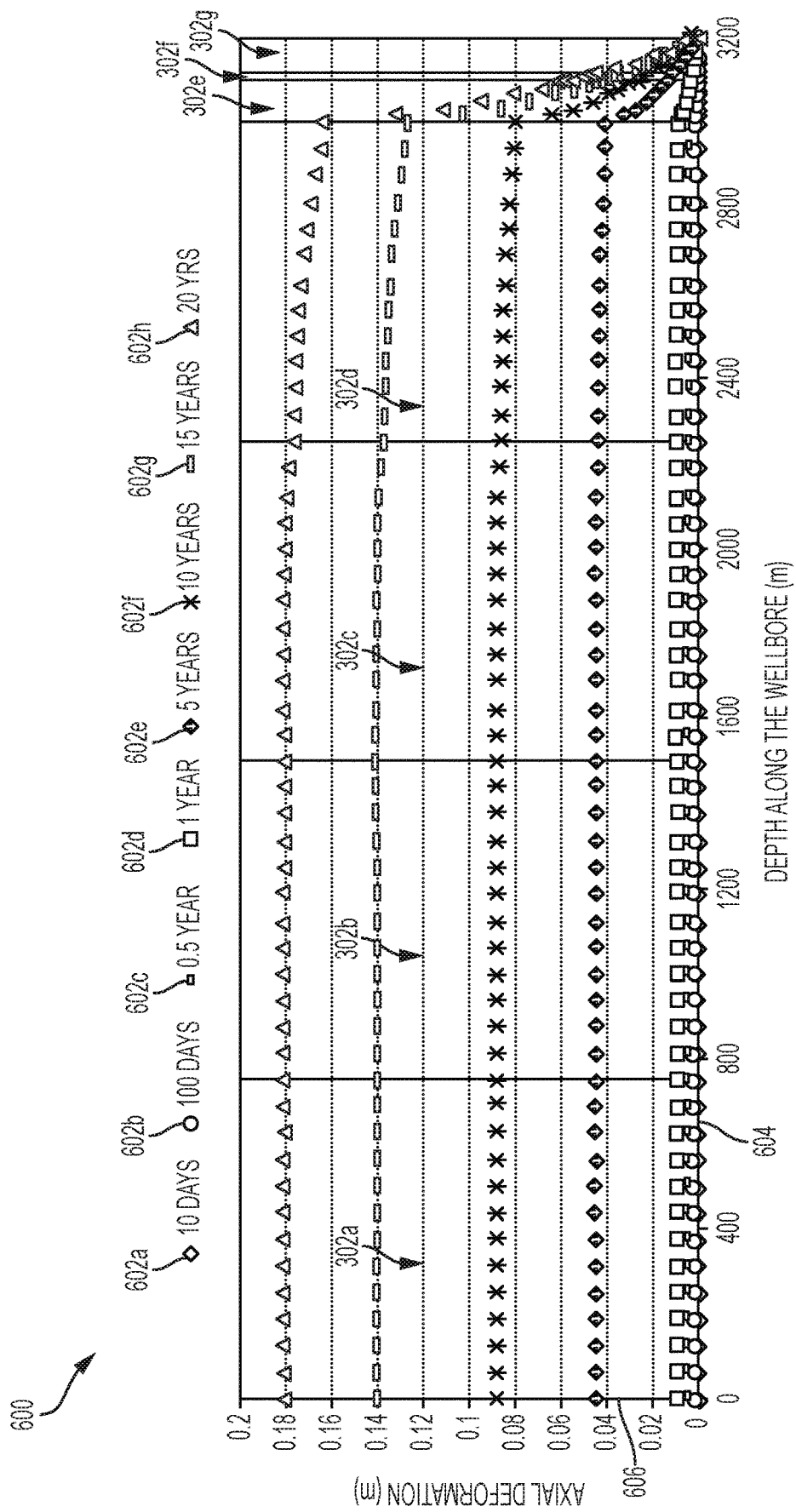
FIG. 6 is a chart depicting axial deformation of a formation as a function of depth along a wellbore at a particular radial distance for varying time intervals according to some aspects of the present disclosure.

FIG. 6 is a chart 600 depicting axial deformation of the formation 106 as a function of depth along the wellbore 104 at a particular radial extent from a mouth of the wellbore 104 for varying time intervals according to some aspects. As illustrated, the chart 600 includes an abscissa 604 representing a depth along the wellbore 104 in meters, and the chart 600 includes an ordinate 606 representing axial deformation along the wellbore 104 in meters. The depth to axial deformation is charted at 10 days by line 602a, 100 days by line 602b, 0.5 years by line 602c, 1 year by line 602d, 5 years by line 602e, 10 years by line 602f, 15 years by line 602g, and 20 years by line 602h.

The chart 600 is divided into the formation layers 302a-302g described above with respect to FIG. 3. Each of the formation layers 302a-302g may represent layers of the formation 106 with different physical properties. Accordingly, the field scale analysis may react differently in each of the formation layers 302a-302g. The axial deformation shown by lines 602a-602h indicates that the axial deformation of the formation 106 surrounding the wellbore 104 generally increases over time at every depth (e.g., formation layer 302) shown in the chart 600. Further, the chart 600 shows that the axial deformation begins at the deepest formation layer 302g, begins leveling off at the formation layer 302d, and carries through to the surface (e.g., an uphole side of the formation layer 302a). The axial deformation may be a result subsidence and compaction of the formation 106 surrounding the wellbore 104, which may place a strain on the cement sheath 102 within the wellbore 104.

While the chart 600 depicts axial deformation of the formation 106 along the wellbore 104, lateral deformation may also be predicted using the field scale analysis and a ratio of the lateral deformation to wellbore depth may be depicted using a chart similar to the chart 600. For example, if the wellbore 104 is drilled through a formation layer boundary that is not horizontal (e.g., the boundary between two formation layers 302 is at an angle other than 90 degrees relative to the direction of the wellbore 104), lateral deformation of the formation may occur along the wellbore 104 if one formation layer subsides while the other maintains structural integrity. In one or more examples, lateral deformation may be ignored due to a limited effect of the lateral movement of the formation 106 on the boundary condition. By ignoring the lateral deformation, computational efficiency may be increased due to a smaller number of computations used in performing the field scale model 202.

Figure 7:
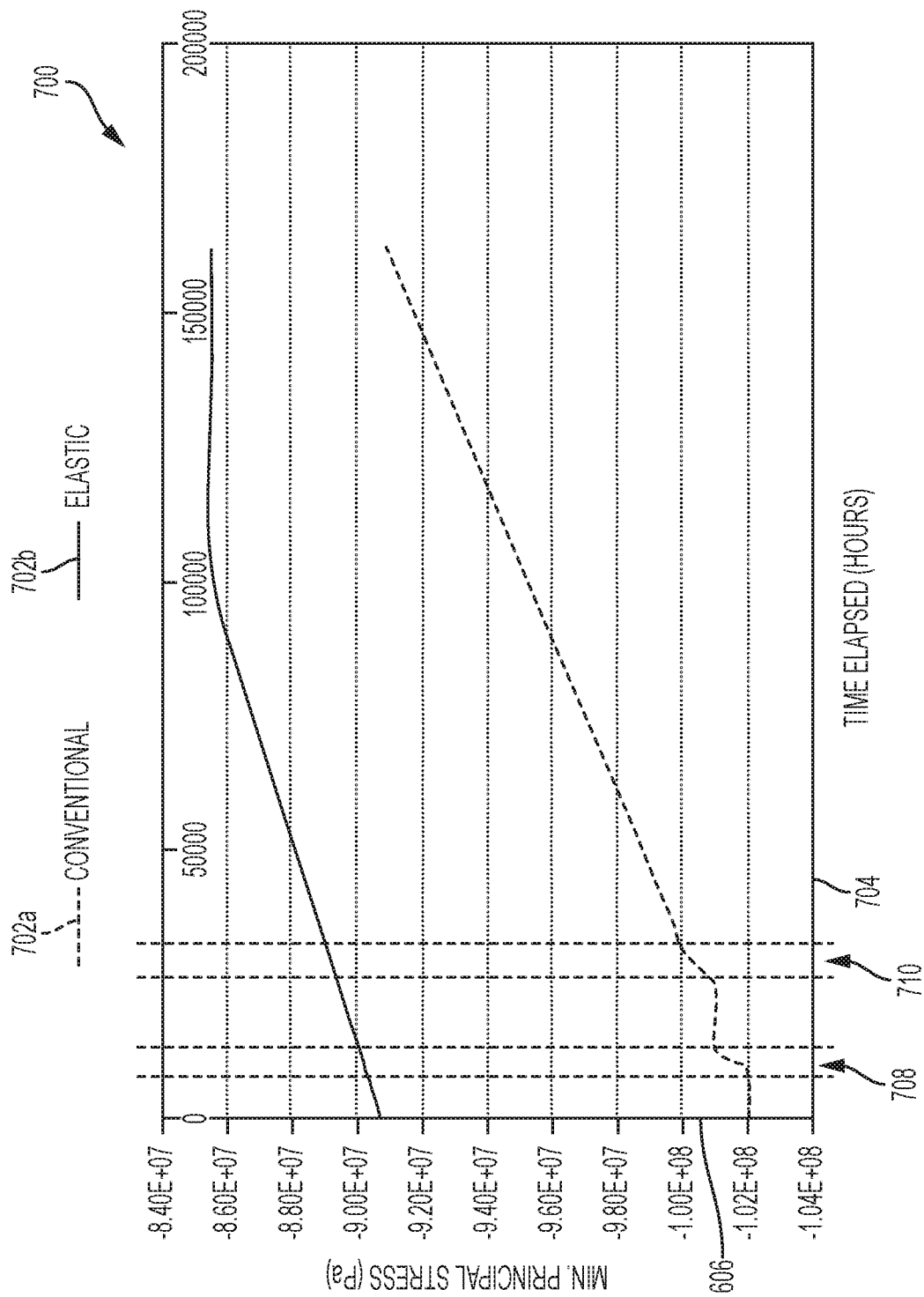
FIG. 7 is a chart depicting an example of an indication of a minimum principal stress predicted to act on a conventional cement sheath and an elastic cement sheath positioned within a wellbore over an elapsed time according to some aspects of the present disclosure.

FIG. 7 is a chart depicting an example of an indication of a minimum principal stress predicted to act on a conventional cement sheath and an elastic cement sheath positioned within the wellbore 104 over an elapsed time according to some aspects based on the wellbore scale analysis. Although the elapsed time shown in FIG. 7 is within a production load, the cement sheath 102 is also subjected to well construction loads before also experiencing the production loads. Thus, stress and deformation history of the cement sheath 102 prior to production may also be analyzed as a component of the design of the cement sheath 102. In this manner, all of the loads experienced by the cement sheath 102 (e.g., pre-production and during production) may be taken into account when designing the cement sheath 102.

As illustrated, the chart 700 includes an abscissa 704 representing an elapsed time in hours, and the chart 700 includes an ordinate 706 representing a minimum principal stress on the cement sheaths 102 in pascals. The time to minimum principal stress ratio is charted for a conventional cement sheath 102 by line 702a and for an elastic cement sheath 102 by line 702b. The elastic cement sheath may be a cement sheath 102 that includes lower compressional stress characteristics than a conventional cement sheath 102. Other materials may replace the cement sheath 102, and the minimum principal stress for those materials may also be determined using the wellbore scale analysis. The cement sheath 102 itself may be replaced by any other competent materials that have the capability to offer zonal isolation, such as resins or mixtures of resins and cement.

The time to minimum principal stress ratio depicted in the chart 700 may be based on the results of the wellbore scale analysis. Additionally, a designer of the cement sheath 102 may choose to track other principal stresses along with the minimum and define criteria associated with the other principal stresses to identify if the cement sheath will remain intact. While the minimum principal stress generally increases over the time elapsed, a number of considerations may affect how quickly the minimum principal stress acting on the cement sheath 102 increases. For example, as indicated in time windows 708 and 710, a predicted increase in a hydrocarbon production rate may result in an increase in a rate of subsidence in the formation 106 and an accompanying increase in the rate of change of the expected minimum principal stress acting on the conventional cement sheath 102, as indicated by the line 702a. In an example, the predicted increases in production may provide minimal changes to a rate of change of the expected minimum principal stress acting on the elastic cement sheath 102, as indicated by the line 702b. However, the minimum principal stress acting on the elastic cement sheath 102 may start at a level greater than the minimum principal stress acting on the conventional cement sheath 102.

A cement mixture for the cement sheath 102 may designed based on the expected minimum principal stress over the elapsed time. For example, the minimum principal stress may be indicative of the stress acting on the cement sheath 102 that results in failure of the cement sheath 102. Accordingly, the cement mixture may be designed to withstand the expected minimum principal stress acting on the cement sheath 102 over the lifetime of the well system 100. Once the cement mixture is identified that is able to withstand the expected minimum principal stress, the cement sheath 102 using the cement mixture may be installed within the wellbore 104.

In one or more examples, the wellbore scale analysis that generates the minimum principal stress to time may focus only on the formation layers 302 that cause all or most of the subsidence experienced surrounding the wellbore 104. Because these formation layers 302 result in most of the subsidence, the formation layers 302 may also provide the most stress on the cement sheath 102. In such an example, computational efficiency of the wellbore scale analysis may be increased due to a smaller number of formation layers 302 that are modeled and analyzed at the wellbore scale.

In some aspects, systems, devices, and methods for designing and installing a cement sheath within a wellbore are provided according to one or more of the following examples:

As used below, any reference to a series of examples is to be understood as a reference to each of those examples disjunctively (e.g., "Examples 1-4" is to be understood as "Examples 1, 2, 3, or 4").

Example 1 is a method, comprising: performing a field scale analysis on a formation surrounding a wellbore to output boundary conditions comprising: a pore pressure of the formation; and a three-dimensional movement of the formation; performing a wellbore scale analysis based on the boundary conditions, a wellbore scale model, wellbore conditions, and cement material properties to output an indication of stress applied over time to a cement sheath within the wellbore; determining cement material properties of the cement sheath to withstand the stress applied over time outputted by the wellbore scale analysis; and installing the cement sheath, including the cement material properties, within the wellbore.

Example 2 is the method of example 1, wherein the three-dimensional movement of the formation comprises an axial movement of the formation, a lateral movement of the formation, or both.

Example 3 is the method of example(s) 1-2, wherein the field scale analysis is based on a field scale model and formation material properties, and wherein the field scale model is based on field geometry and production loads, injection loads, or fracturing loads at the wellbore and a neighboring well.

Example 4 is the method of example(s) 1-3, wherein the field scale analysis uses a Cam-Clay type model to represent formation layers that exhibit pore compaction.

Example 5 is the method of example(s) 1-4, wherein the wellbore conditions comprise wellbore geometry and wellbore construction and completion loads.

Example 6 is the method of example(s) 1-5, wherein the wellbore scale analysis is further based on casing material properties.

Example 7 is the method of example(s) 1-6, further comprising: designing a cement mixture of the cement sheath based on the cement material properties.

Example 8 is the method of example(s) 1-7, wherein the pore pressures and the three-dimensional movements of the formation are variable over time based on expected production loads, injection loads, or fracturing loads of the wellbore.

Example 9 is a non-transitory computer-readable medium that includes instructions that are executable by a processing device to perform operations comprising: performing a field scale analysis on a formation surrounding a wellbore to output boundary conditions comprising: a pore pressure of the formation; and a three-dimensional movement of the formation; performing a wellbore scale analysis based on the boundary conditions, a wellbore scale model, and cement material properties to output an indication of stress applied over time to a cement sheath within the wellbore; calibrating the cement material properties of the cement sheath to withstand the stress applied over time outputted by the wellbore scale analysis; and outputting the calibrated cement material properties usable to design a cement mixture for the cement sheath.

Example 10 is the non-transitory computer-readable medium of example 9, wherein the wellbore scale analysis is performed on a single layer of the formation.

Example 11 is the non-transitory computer-readable medium of example(s) 9-10, wherein the field scale analysis uses a Cam-Clay type model to represent porous formation layers that exhibit pore compaction and a Mohr-Coulomb model or a Drucker-Prager model to represent nonporous formation layers that exhibit volume conservation.

Example 12 is the non-transitory computer-readable medium of example(s) 9-11, wherein calibrating the cement material properties of the cement sheath to withstand the stress applied over time comprises calibrating the cement material properties to withstand the stress applied over a production lifespan of the wellbore.

Example 13 is the non-transitory computer-readable medium of example(s) 9-12, wherein the wellbore scale model is based on wellbore geometry and wellbore construction and completion loads.

Example 14 is the non-transitory computer-readable medium of example(s) 9-13, wherein the field scale analysis is based on a field scale model and formation material properties, and wherein the formation material properties comprise tensile strength of the formation, compressive strength of the formation, Young's modulus of the formation, Poisson's ratio of the formation, or any combination thereof.

Example 15 is the non-transitory computer-readable medium of example(s) 9-14, wherein the field scale analysis is performed on the formation within a 5 km radius of the wellbore, and the wellbore scale analysis is performed on the formation within a wellbore scale radius of the wellbore, wherein the wellbore scale radius is 50 times a wellbore radius of the wellbore.

Example 16 is a computing system, the computing system comprising: a processing device; and a memory device in which instructions are stored that are executable by the processing device for causing the processing device to: perform a field scale analysis on formation layers of a formation surrounding a wellbore to output boundary conditions of the formation layers comprising: a pore pressure of the formation layers; and a three-dimensional movement of the formation layers; perform a wellbore scale analysis based on the boundary conditions, a wellbore scale model, and cement material properties to output an indication of stress applied over time to a cement sheath within the wellbore; calibrate the cement material properties of the cement sheath to withstand the stress applied over time outputted by the wellbore scale analysis; and output the calibrated cement material properties usable to design a cement mixture for the cement sheath.

Example 17 is the computing system of example 16, wherein the formation layers are determined based on logging while drilling operations, measurement while drilling operations, or both.

Example 18 is the computing system of example(s) 16-17, wherein the pore pressure of the formation layers and the three-dimensional movement of the formation layers vary over time based on production loads of the wellbore.

Example 19 is the computing system of example(s) 16-18, wherein the field scale analysis uses a Cam-Clay type model to represent porous formation layers that exhibit pore compaction and a Mohr-Coulomb model or a Drucker-Prager model to represent nonporous formation layers that exhibit volume conservation.

Example 20 is the computing system of example(s) 16-19, wherein the field scale analysis is based on a field scale model and formation material properties, and wherein the wellbore scale model is based on wellbore geometry and wellbore construction and completion loads.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A method, comprising:
   performing a field scale analysis on a formation surrounding a wellbore to output boundary conditions comprising:
   a pore pressure of the formation; and
   a three-dimensional movement of the formation, wherein the field scale analysis is performed on the formation within a 5 km radius of the wellbore;
   performing a wellbore scale analysis based on the boundary conditions, a wellbore scale model, wellbore conditions, and cement material properties to output an indication of stress applied over time to a cement sheath within the wellbore, wherein the wellbore scale analysis is performed on the formation within a wellbore scale radius of the wellbore that is 50 times a wellbore radius of the wellbore;

determining cement material properties of the cement sheath to withstand the stress applied over time outputted by the wellbore scale analysis; and installing the cement sheath within the wellbore, the cement sheath comprising a cement mixture that includes the cement material properties.

2. The method of claim 1, wherein the three-dimensional movement of the formation comprises an axial movement of the formation, a lateral movement of the formation, or both.

3. The method of claim 1, wherein the field scale analysis is based on a field scale model and formation material properties, and wherein the field scale model is based on field geometry and production loads, injection loads, or fracturing loads at the wellbore and a neighboring well.

4. The method of claim 1, wherein the field scale analysis uses a Cam-Clay type model to represent formation layers that exhibit pore compaction.

5. The method of claim 1, wherein the wellbore conditions comprise wellbore geometry and wellbore construction and completion loads.

6. The method of claim 1, wherein the wellbore scale analysis is further based on casing material properties.

7. The method of claim 1, further comprising:
designing the cement mixture of the cement sheath based on the cement material properties.

8. The method of claim 1, wherein the pore pressure and the three-dimensional movement of the formation are variable over time based on expected production loads, injection loads, or fracturing loads of the wellbore.

9. A non-transitory computer-readable medium that includes instructions that are executable by a processing device to perform operations comprising:

performing a field scale analysis on a formation surrounding a wellbore to output boundary conditions comprising:
a pore pressure of the formation; and
a three-dimensional movement of the formation, wherein the field scale analysis is performed on the formation within a 5 km radius of the wellbore;

performing a wellbore scale analysis based on the boundary conditions, a wellbore scale model, and cement material properties to output an indication of stress applied over time to a cement sheath within the wellbore, wherein the wellbore scale analysis is performed on the formation within a wellbore scale radius of the wellbore that is 50 times a wellbore radius of the wellbore;

calibrating the cement material properties of the cement sheath to withstand the stress applied over time outputted by the wellbore scale analysis; and outputting the calibrated cement material properties usable to design a cement mixture for the cement sheath.

10. The non-transitory computer-readable medium of claim 9, wherein the wellbore scale analysis is performed on a single layer of the formation.

11. The non-transitory computer-readable medium of claim 9, wherein the field scale analysis uses a Cam-Clay type model to represent porous formation layers that exhibit pore compaction and a Mohr-Coulomb model or a Drucker-Prager model to represent nonporous formation layers that exhibit volume conservation.

12. The non-transitory computer-readable medium of claim 9, wherein calibrating the cement material properties of the cement sheath to withstand the stress applied over time comprises calibrating the cement material properties to withstand the stress applied over a production lifespan of the wellbore.

13. The non-transitory computer-readable medium of claim 9, wherein the wellbore scale model is based on wellbore geometry and wellbore construction and completion loads.

14. The non-transitory computer-readable medium of claim 9, wherein the field scale analysis is based on a field scale model and formation material properties, and wherein the formation material properties comprise tensile strength of the formation, compressive strength of the formation, Young's modulus of the formation, Poisson's ratio of the formation, or any combination thereof.

15. A computing system, the computing system comprising:
a processing device; and
a memory device in which instructions are stored that are executable by the processing device for causing the processing device to:

perform a field scale analysis on formation layers of a formation surrounding a wellbore to output boundary conditions of the formation layers comprising:
a pore pressure of the formation layers; and
a three-dimensional movement of the formation layers, wherein the field scale analysis is performed on the formation within a 5 km radius of the wellbore;

perform a wellbore scale analysis based on the boundary conditions, a wellbore scale model, and cement material properties to output an indication of stress applied over time to a cement sheath within the wellbore, wherein the wellbore scale analysis is performed on the formation within a wellbore scale radius of the wellbore that is 50 times a wellbore radius of the wellbore;

calibrate the cement material properties of the cement sheath to withstand the stress applied over time outputted by the wellbore scale analysis; and output the calibrated cement material properties usable to design a cement mixture for the cement sheath.

16. The computing system of claim 15, wherein the formation layers are determined based on logging while drilling operations, measurement while drilling operations, or both.

17. The computing system of claim 15, wherein the pore pressure of the formation layers and the three-dimensional movement of the formation layers vary over time based on production loads of the wellbore.

18. The computing system of claim 15, wherein the field scale analysis uses a Cam-Clay type model to represent porous formation layers that exhibit pore compaction and a Mohr-Coulomb model or a Drucker-Prager model to represent nonporous formation layers that exhibit volume conservation.

19. The computing system of claim 15, wherein the field scale analysis is based on a field scale model and formation material properties, and wherein the wellbore scale model is based on wellbore geometry and wellbore construction and completion loads.

* * * * *